US 006734467B2

(12) United States Patent
Schlereth et al.

(10) Patent No.: US 6,734,467 B2
(45) Date of Patent: May 11, 2004

(54) LED WHITE LIGHT SOURCE WITH BROADBAND EXCITATION

(75) Inventors: Karl-Heinz Schlereth, Burglengenfeld (DE); Volker Härle, Laaber (DE); Norbert Stath, Regensburg (DE)

(73) Assignee: Osram Opto Semiconductors GmbH & Co. oHG, Regensburg (DE)

( * ) Notice: Subject to any disclaimer, the term of this patent is extended or adjusted under 35 U.S.C. 154(b) by 0 days.

(21) Appl. No.: 10/137,885

(22) Filed: May 3, 2002

(65) Prior Publication Data

US 2002/0167014 A1 Nov. 14, 2002

Related U.S. Application Data

(63) Continuation of application No. PCT/DE00/03520, filed on Oct. 6, 2000.

(30) Foreign Application Priority Data

Nov. 3, 1999 (DE) .......................................... 199 52 932

(51) Int. Cl.⁷ .............................................. H01L 29/20
(52) U.S. Cl. ........................... 257/89; 257/96; 257/100
(58) Field of Search ............................ 257/79, 89, 90, 257/96, 100

(56) References Cited

U.S. PATENT DOCUMENTS 3,875,456 A * 4/1975 Kano et al.
3,875,473 A * 4/1975 Lebailly
5,851,905 A  12/1998 McIntosh et al.

FOREIGN PATENT DOCUMENTS

DE  3804293 A1  8/1989
DE  29914941 U1  12/1999
JP  10-22525  * 1/1998

OTHER PUBLICATIONS

"Integrated multiplayer GaAs lasers separated by tunnel junctions," J.P. van der Ziel et al., Appl. Phys. Lett. 41(6) Sep. 15, 1982, pp. 499–501.*
"Integrated multiplayer GaAs lasers separated by tunnel junctions", J.P. van der Ziel et al., Appl. Phus. Lett 41(6), Sep. 15, 1982, pp. 499–501.
Japanese Patent Abstract No. 01231380 (Kyosuke), dated Sep. 14, 1989.
Japanese Patent Abstract No. 06326364 (Eiji), dated Nov. 25, 1994.
Published International Application No. 98/12757, (Klaus Höhn et al.), dated Mar. 26, 1998.
Published International Application No. 98/54929 (Leendert Vriens et al.), dated Dec. 3, 1998.
Product Information: HLMP–CW15/16 White LEDs from Hewlett–Packard, MIP Edition 1, 1999, 1 sheet.

* cited by examiner

Primary Examiner—Sara Crane
(74) Attorney, Agent, or Firm—Laurence A. Greenberg; Werner H. Stemer; Ralph E. Locher

(57) ABSTRACT

A white light source is described and has a UV-/blue-emitting semiconductor LED and an embedding compound provided with phosphor particles. The LED is provided with a plurality of light-emitting zones that are applied within a layer structure on a common substrate. An emission maxima of the light-emitting zones are energetically detuned relative to one another by different choice of the composition or of the layer thickness of the semiconductor material.

13 Claims, 3 Drawing Sheets

LED WHITE LIGHT SOURCE WITH BROADBAND EXCITATION

CROSS-REFERENCE TO RELATED APPLICATIONS

This application is a continuation of copending International Application No. PCT/DE00/03520, filed Oct. 6, 2000, which designated the United States and was not published in English.

BACKGROUND OF THE INVENTION

Field of the Invention

The present invention relates to a light emitting diode (LED) white light source. In particular, the present invention relates to an LED white light source having a semiconductor LED based on GaN or InGaN, which is at least partly surrounded by an encapsulation made of a transparent material which contains a converter substance for at least partial wavelength conversion of the light emitted by the LED. The LED has a plurality of light-emitting zones by which a relatively broadband light emission spectrum is generated energetically above the emission spectrum of the converter substance.

A component of this type is disclosed for example in Published, German Patent Application DE 38 04 293 A1, which describes a configuration having an electroluminescent or laser diode in which the emission spectrum irradiated by the diode is shifted toward longer wavelengths by a plastic element treated with a phosphorescent, light-converting organic dye. The light radiated by the configuration consequently has a different color from the light emitted by the light-emitting diode. Depending on the nature of the dye added to the plastic, light-emitting diode configurations that emit light in different colors can be produced using one and the same type of light-emitting diode.

In many potential areas of application for light-emitting diodes, such as, for example, in display elements in motor vehicle dashboards, lighting in aircraft and automobiles, and in full-color LED displays, there is increasingly a demand for light-emitting diode configurations with which polychromatic light in particular white light, can be produced. International Patent Disclosure WO 98/12757 describes a wavelength-converting potting compound for an electroluminescent component having a body which emits ultraviolet, blue or green light, based on a transparent epoxy resin treated with a luminescent material, in particular with an inorganic luminescent material pigment powder with luminescent material pigments from the group of phosphors. As a preferred embodiment, a description is given of a white light source in which a radiation-emitting semiconductor LED based on GaN, GaInN, GaAlN or GaInAlN is described with an emission maximum of between 420 nm and 460 nm and a luminescent material which is chosen such that a blue radiation emitted by the semiconductor body is converted into complimentary wavelength ranges, in particular blue and yellow, or to form additive color triads, e.g. blue, green and red. In this case, the yellow or the green and red light is generated by the luminescent materials. The hue (color locus in the CIE chromaticity diagram) of the white light generated in this way can be varied in this case by suitable choice of the luminescent material or materials with regard to mixture and concentration.

Likewise, International Patent Disclosure WO 98/54929 discloses a visible-light-emitting semiconductor component having a UV/blue LED which is disposed in a depression of a carrier body, whose surface has a light-reflection layer and is filled with a transparent material which surrounds the LED at its light exit sides. In order to improve the coupling-out of light, the transparent material has a refractive index that is lower than the refractive index of the light-active region of the LED.

U.S. Pat. No. 5,851,905 and Japanese Patent JP 0100022525 in each case describe an LED chip with stacked quantum wells that have such different emission wavelengths that the chip emits white light.

The previous known white light sources of the type described have the disadvantage, however, that the spectral light emission curve of the white light sources is still not optimal, so that the physiological-optical impression of a white light source is in many cases not provided to a sufficient extent. This is due not to the luminescent materials used, for instance, but rather to the fact that, during the wavelength conversion, the energy gap between absorbed photon and emitted photon cannot be arbitrarily reduced. For this reason, a spectral hole is produced in the emission curve.

This problem could be solved by disposing an additional LED component with an emission maximum in the blue wavelength range. However, the solution is unsatisfactory since it is associated with a considerable additional outlay on material and manufacturing time, since not only must a further semiconductor component be fabricated but it must be specifically contact-connected and wired in the white light source to be manufactured.

SUMMARY OF THE INVENTION

It is accordingly an object of the invention to provide an LED white light source with broadband excitation which overcomes the above-mentioned disadvantages of the prior art devices of this general type, in which the light spectrum emitted by it is improved in the sense of an improved optical-physiological white light impression. In particular, it is an object of the present invention to specify an improved white light source in which the emitted light spectrum has an intensity profile that is as uniform as possible.

With the foregoing and other objects in view there is provided, in accordance with the invention, a white light source. The white light source contains a semiconductor light emitting diode having a light exit side and a main radiating direction, and the semiconductor LED emits a light. An encapsulation at least partly surrounds the semiconductor LED and is made of a transparent material containing a converter substance for at least partial wavelength conversion of the light emitted by the semiconductor LED. The semiconductor LED has at least two light-emitting zones embodied such that an maxima of their emission spectra are energetically detuned relative to one another and lie above an emission spectrum of the converter substance. The light-emitting zones are disposed one behind another in the main radiating direction of the semiconductor LED such that an energy of an emission maximum increases in a direction of the light exit side of the semiconductor LED.

Accordingly, the present invention describes a white light source having the semiconductor LED and the encapsulation, which at least partly surrounds the LED and is made of a transparent material containing the converter substance for at least partial wavelength conversion of the light emitted by the LED. In which case the LED has at least two light-emitting zones which are formed in such a way that the maxima of their emission spectra are energetically detuned relative to one another and lie above the emission spectrum of the converter substance, and which are furthermore disposed one behind the other in a main radiating direction of the LED in such a way that the photon energy of the emission maximum increases in the direction of the light exit side of the LED.

This order of the light-emitting zones prevents the longer-wave photons from being absorbed again in the zones with short-wave emission. Consequently, the spectral hole that is present in the case of white light sources according to the prior art is filled by virtue of the invention. This can be brought about by a single additional light-emitting zone or else by a larger number of additional light-emitting zones that energetically adjoin the first emission maximum of the converter substance above the maximum. The light-emitting zones are disposed on a common substrate and between two outer electrical contact layers, so that they can be connected to a common voltage source.

In a first embodiment, the LED has exactly one pn junction and the light-emitting zones are formed by a corresponding number of single or multiple quantum well layers of different thickness and/or of different material composition. In this embodiment, the energetic displacement between the emission maxima results from the displacement of the bottom most conduction band and the top most valance band in the case of variation of the thickness and/or of the material composition in the quantum well layers. In the simplest conceivable exemplary embodiment, two light-emitting zones are formed by two single quantum well layers made of InGaN of different thickness and/or different Indium concentration in each case being embedded and disposed one behind the other between two layers with a larger band gap.

In a second embodiment, the light-emitting zones of the LED are formed by a corresponding number of pn junctions. In this case, the pn junctions may be formed from a bulk material of different material composition, i.e. for example different proportion of indium in the material combination InGaN. However, for their part the pn junctions may also in each case contain a single or multiple quantum well layer and the quantum well layers of the different pn junctions may in this case have different thicknesses and/or material compositions. Respectively adjacent pn junctions can be electrically connected to one another in a particularly simple manner by a metallic compact layer, such as a solder layer. However, the adjacent pn junctions can also be monolithically integrated by the junctions being isolated from one another by extremely low-resistance np tunnel junctions which contain an $n^+$-doped layer and a directly adjoining $p^+$-doped layer. The $n^+$-doped layer adjoins the n-type region of one pn junction and the $p^+$-doped layer adjoins the p-type region of the other pn junction, and the $n^+$-type and $p^+$-type doping concentration, respectively, being chosen in such a way as to produce a relatively low electrical resistance of the tunnel junction during operation. This type of connection of two pn junctions is known per se in the prior art (e.g. van der Ziel, et al., "Appl. Phys. Lett." 41, p. 500, 1982) and will not, therefore, be discussed any further at this point.

Other features which are considered as characteristic for the invention are set forth in the appended claims.

Although the invention is illustrated and described herein as embodied in an LED white light source with broadband excitation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
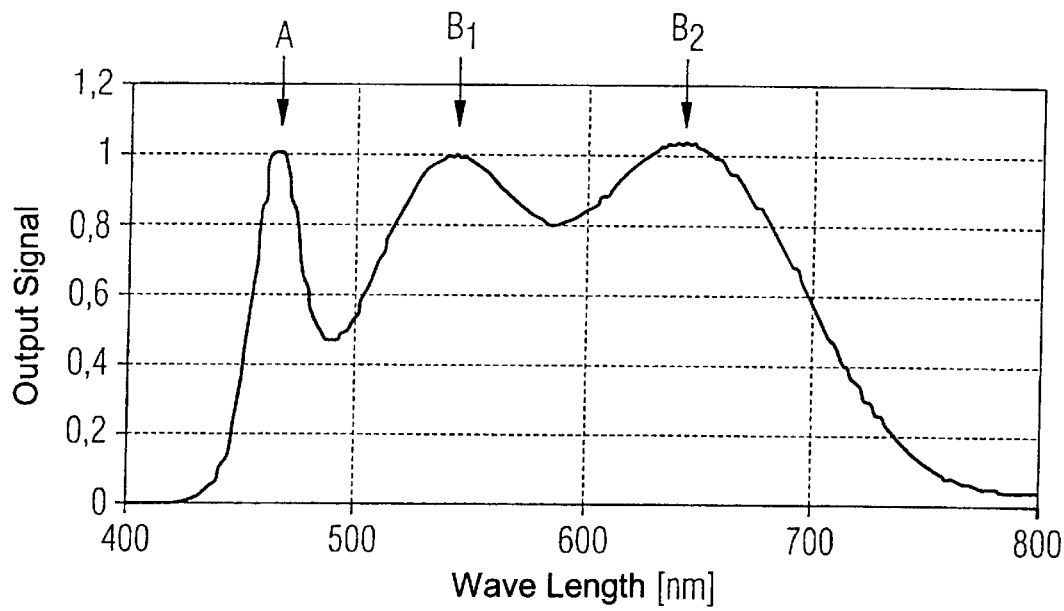
FIG. 3 is a graph showing an emission spectrum of a conventional, commercially available white light source.

Referring now to the figures of the drawing in detail and first, particularly, to FIG. 3 thereof, there is shown a spectral emission curve of a white light source that is commercially available from Hewlett-Packard and bears the product designation HLMP-CW15/16, which uses an InGaN LED and a potting compound with red and green phosphor particles. In the emission curve, an emission maximum of the LED is designated by A, while an emission maxima of the luminescent material are designated by $B_1$ and $B_2$. Such an emission spectrum regularly arises by virtue of the fact that only a proportion of the light radiation emitted by the LED is ever absorbed in the conversion material and converted into light of a longer wavelength. The physically governed energy gap between A and B1 gives rise to a spectral hole, which significantly reduces the blue component of the spectrum.

The problem can be solved by disposing an additional LED component with an emission maximum in the blue wavelength range. However, the solution is unsatisfactory since it is associated with a considerable additional outlay on material and manufacturing time, since not only must a further semiconductor component be fabricated but it must be specifically contact-connected and wired in the white light source to be manufactured.

Figure 1:
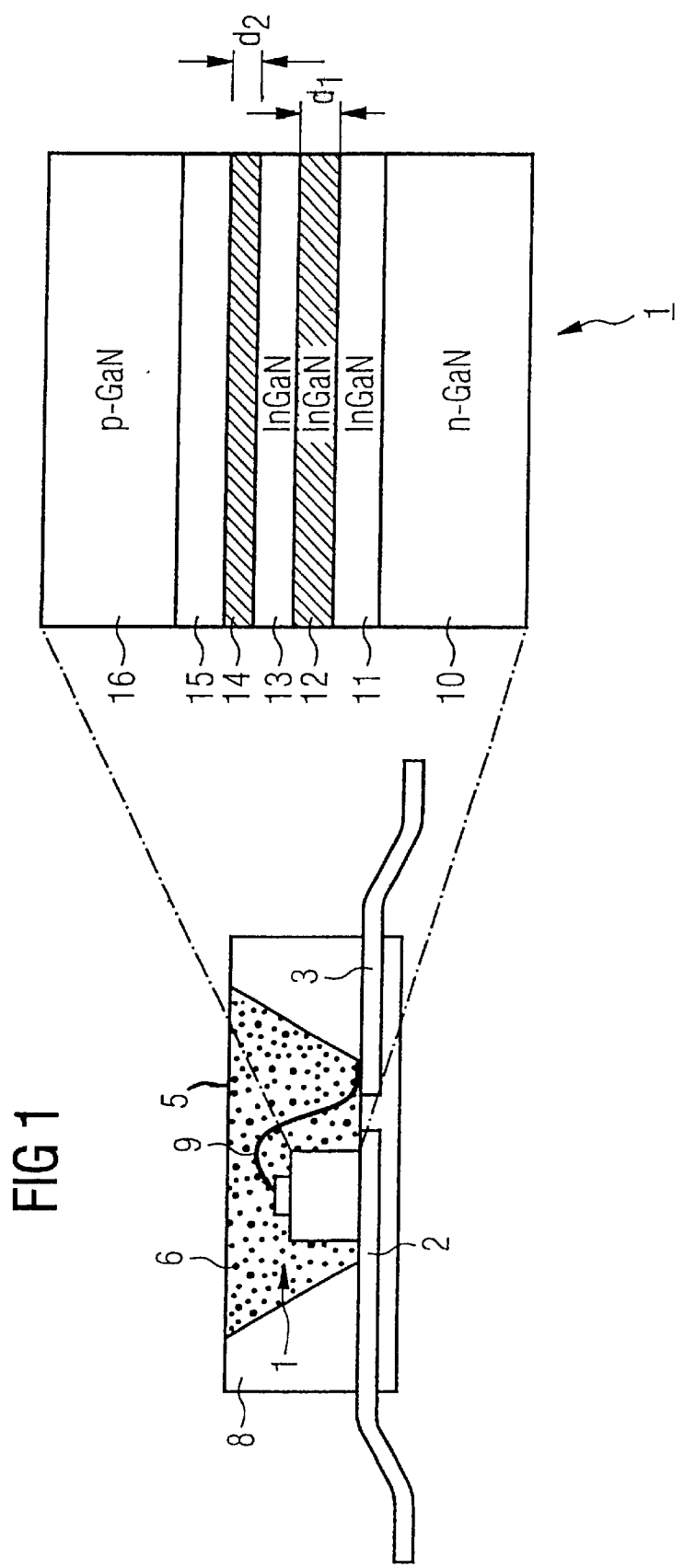
FIG. 1 is a diagrammatic, cross-sectional view of a white light source in accordance with a first embodiment with a semiconductor layer construction shown enlarged according to the invention.

In FIG. 1, there is shown a white light source according to the invention. A UV-blue-emitting semiconductor LED 1 is fixed by its rear side contact on a first electrical connection 2 by an electrically conductive bonding method, e.g. a metallic solder or a conductive adhesive such as a conductive silver. A front side contact is connected to a second electrical connection 3 by a bonding wire 9.

The free surfaces of the semiconductor LED 1 and partial regions of the electrical connections 2 and 3 are directly enclosed by a cured, wavelength-converting potting compound 5. The compound 5 may contain for example 80–90% by weight of epoxy resin and ≦15% by weight of luminescent material particles 6 containing YAG:Ce, further constituents such as adhesion promoters, processing aids, hydrophobizing agents, mineral diffusers and also thixotropic agents being contained for the rest.

The right-hand part of the drawing in FIG. 1 shows the semiconductor layer construction of the LED 1 enlarged and in detail. On an n-doped GaN substrate 10, by a growth method such as metal organic chemical vapor deposition (MOCVD) or molecular beam epitaxy (MBE), semiconductor layers made of InGaN with a changing proportion of indium are grown with the aim of fabricating two single quantum well layers. A band gap of the material $In_xGa_{1-x}N$ decreases as the Indium proportion X increases.

First, a nominally undoped InGaN barrier layer 11 with a relatively small indium proportion x is grown. An InGaN quantum well layer 12 with a relatively large indium proportion x and a thickness $d_1$ is applied thereon. The quantum well layer 12 is followed by a further InGaN barrier layer 13. Consequently, the quantum well layer 12 forms a first light-emitting zone whose emission maximum is determined both by its thickness and by its indium proportion and also the indium proportion of the barrier layers. A further InGaN quantum well layer 14 with a relatively low Indium proportion x and a thickness $d_2 < d_1$ is then applied to the barrier layer 13. The quantum well layer has grown on it once again an InGaN barrier layer 15 with a relatively large indium proportion x, whereon a p-doped GaN contact layer 16 terminates the semiconductor layer sequence.

Consequently, a second light-emitting zone is formed by the InGaN quantum well layer 14. The quantum well layers 12 and 14 may have the same indium proportion. In this case, as a result of the larger gap between the bottom most conduction band and the topmost valence band, the upper quantum well layer 14 has the energetically higher emission maximum than the quantum well layer 12. For the fine tuning of the energetic displacement between the quantum well layers 12 and 14, however, it is also possible for the indium proportion additionally to be varied. Thus, by way of example, at the other extreme, it is also for the thickness of the two quantum well layers 12 and 14 to be identical, but for the energetic detuning to be brought out solely by the different indium concentration. The layers 11 to 15 forming the light-active section of the layer structure are nominally undoped.

By virtue of the fact that the quantum well layer 12 with the smaller photon energy of the band gap is disposed at the bottom, the light emitted by it passes through the overlying layers—having a higher band gap—virtually without any losses into the conversion compound 5 surrounding the LED 1.

Figure 4:
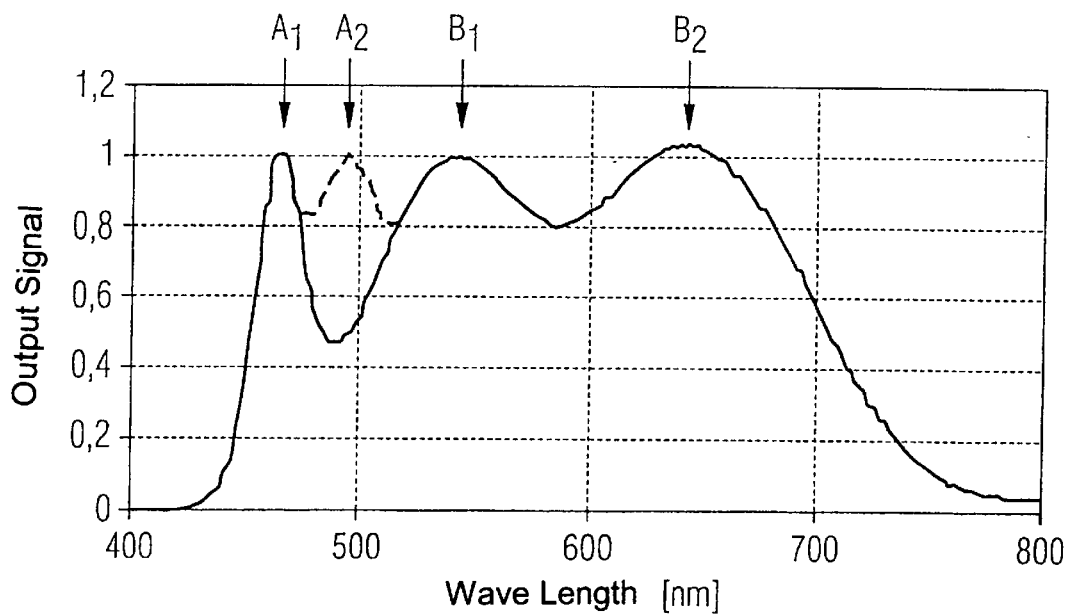
FIG. 4 is a graph of an emission spectrum of the white light source according to the invention.

FIG. 4 illustrates, by way of example, an emission spectrum of the kind that can be obtained by a white light source in accordance with FIG. 1. In the emission spectrum, the light radiation emitted by the quantum well layer 12 appears as a further line $A_2$. This portion of the emission spectrum is formed by radiation of the quantum well layer 12 that has passed through the conversion material 5 without being converted in the phosphor particles 6. The line $A_2$ thus closes the spectral hole in the emission spectrum, thereby bringing about a more uniform intensity distribution of the emission spectrum.

In this way, it is also possible to dispose more than two quantum well layers one above the other, in which case care should always be taken to ensure that the light radiation of a lower quantum well layer is not absorbed by the overlying semiconductor material. The band gap of the quantum well layers must thus continuously increase in the growth direction of the semiconductor layer structure, which results in that the layer thickness must decrease and/or the indium proportion must decrease.

It is also possible for the single quantum well layers 12 and 14 in FIG. 1 to be replaced in each case by multiple quantum well layers within which the layer thickness and the indium proportion remains constant. Accordingly, it is then also possible to dispose more than two multiple quantum well layers.

Figure 2:
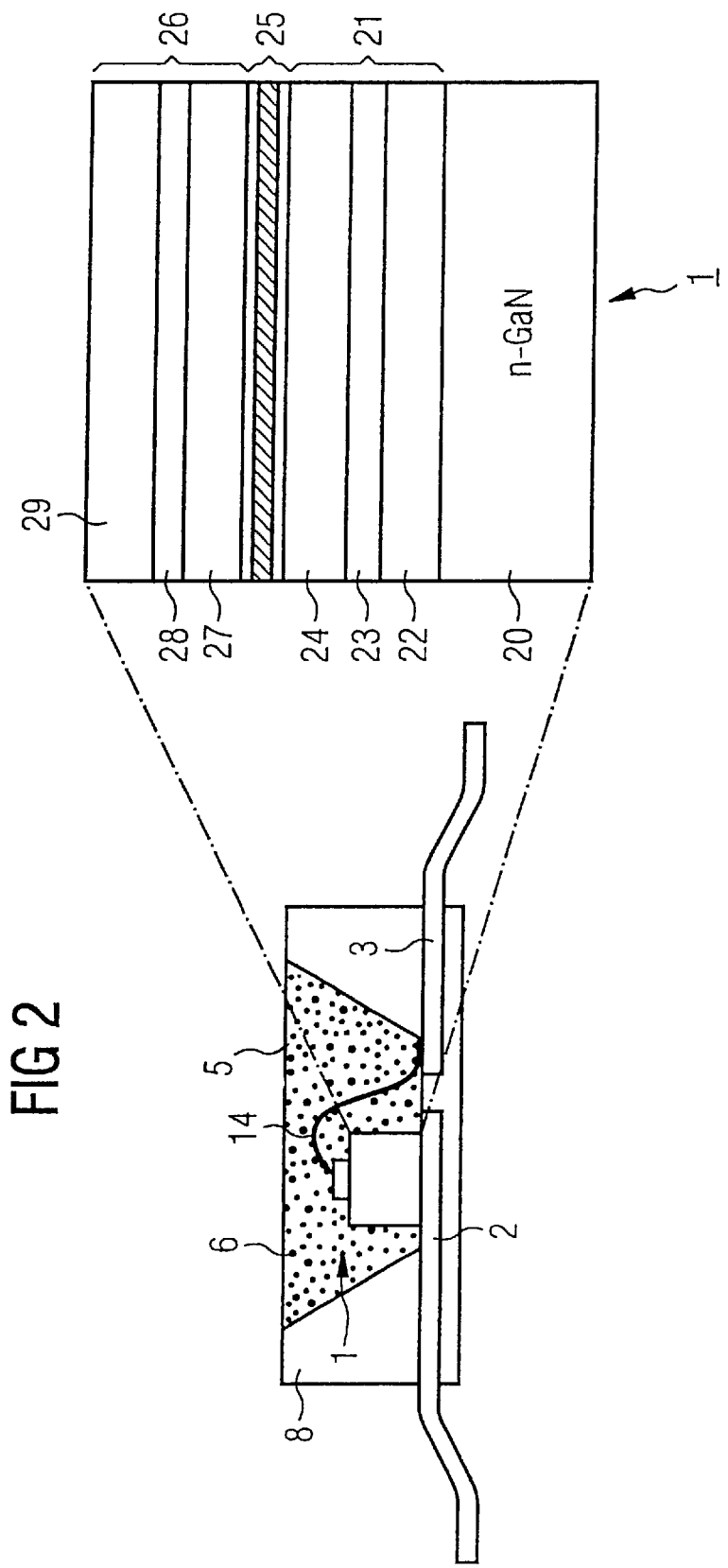
FIG. 2 is a cross-sectional view of the white light source according to a second embodiment with the semiconductor layer construction shown enlarged.

An example of a second embodiment of the white light source according to the invention is illustrated in cross section in FIG. 2. In this embodiment, by way of example, two pn junctions 21 and 26 are stacked vertically one above the other and electrically contact-connected to one another by an $n^+p^+$ tunnel junction 25. The tunnel junction 25 contains two highly doped $n^+$-type and $p^+$-type layers ($10^{20}$ $cm^{-3}$), of which the $n^+$-type layer adjoins the n-type region of one adjacent pn junction and the $p^+$-type layer adjoins the p-type region of the other adjacent pn junction. Each pn junction has an active, light-emitting and intrinsic layer 23 and 28, respectively.

In detail, on an n-doped GaN substrate 20, there are grown an n-doped InGaN layer 22, a p-doped InGaN layer 24, the $n^+p^+$ tunnel junction 25, an n-doped InGaN layer 27 and finally a p-doped InGaN layer 29. Situated between the layers 22 and 24, and 27 and 29, are the light-active zones 23 and 28, respectively, which may be formed either by the space charge zones between the n-type and p-type layers when bulk pn junctions are used, or by specially applied single or multiple quantum well layers. If the pn junctions 21 and 26 are formed from bulk material, the energetic detuning between the light-active zones 23 and 28 must be set by way of the indium proportion. Therefore, the light-active zone 28 has a lower indium proportion. In the case where bulk material is used, the respectively adjoining layers 22, 24 and 27, 29 may also have the same indium proportion as the light-active zones 23 and 28, respectively. In the case where single or multiple quantum well layers are used, reference is made to the explanations with regard to the first embodiment.

Care should be taken to ensure that the $n^+p^+$ tunnel junction 25 is chosen from a material with a sufficiently high band gap, e.g. GaN, so that absorption of the light radiation of the light-active zone 23 does not take place.

If desired, it is also possible for more than two pn junctions to be stacked one above the other and be electrically contact-connected to one another in each case by $n^+p^+$ tunnel junctions.

The advantage of using highly doped tunnel junctions is that the entire semiconductor LED 1 can thus be monolithically fabricated in accordance with the second embodiment and can thus be fabricated in one growth pass. As an alternative to this, however, it may also be provided that the pn junctions are soldered areally to one another or electrically contact-connected to one another in another way by a metallic contact layer 25.

An emission spectrum in accordance with FIG. 4 can also be brought about with an embodiment in accordance with FIG. 2.

The invention has been described in accordance with FIGS. 1 and 2 on the basis of a surface mounted design (SMD) construction, but it can equally be realized in a so-called radial diode.

We claim:

1. A white light source, comprising:
   a semiconductor light emitting diode (LED) having a light exit side and a main radiating direction, said semiconductor LED emitting a light; and
   an encapsulation at least partly surrounding said semiconductor LED and made of a transparent material containing a converter substance for at least partial wavelength conversion of the light emitted by said semiconductor LED;

said semiconductor LED having at least two light-emitting zones embodied such that a maxima of their emission spectra are energetically detuned relative to one another and energetically lie above an emission spectrum of said converter substance, said light-emitting zones disposed one behind another in said main radiating direction of said semiconductor LED such that an energy of an emission maximum increases in a direction of said light exit side of said semiconductor LED.

2. The white light source according to claim 1, wherein said semiconductor LED has exactly one pn junction and said light-emitting zones are embodied by a corresponding number of quantum well layers having at least one of different thicknesses and different material compositions.

3. The white light source according to claim 1, wherein said light-emitting zones are formed by a corresponding number of pn junctions.

4. The white light source according to claim 3, wherein said pn junctions are formed from a bulk material having different material compositions.

5. The white light source according to claim 3, wherein at least one of said pn junctions contains a quantum well selected from the group consisting of a single quantum well layer and a multiple quantum well layer.

6. The white light source according to claim 5, wherein each of said pn junctions contains said quantum well selected from the group consisting of a single quantum well layer and a multiple quantum well layer, said quantum well of different ones of said pn junctions have at least one of different thicknesses and different material compositions.

7. The white light Source according to claim 3, wherein:

each of said pn junctions has an n-type region and a p-type region; and said semiconductor LED has a n+p + tunnel junction contact-connecting respectively adjacent ones of said pn junctions to one another, said $n^+p^+$ tunnel junction containing an $n^{30}$-doped layer and a directly adjoining $p^+$-doped layer, said $n^+$-doped layer adjoining said n-type region of one of said pn junctions and said $p^+$-doped layer adjoining said p-type region of another one of said pn junctions, and said $n^+$-doped layer and said $p^+$-doped layer having an $n^+$-type and $p^+$-type doping concentration, respectively, being chosen in such a way as to produce a relatively low electrical resistance of said n+p+ tunnel junction during operation.

8. The white light source according to claim 3, wherein said semiconductor LED has a metallic contact layer respectively electrically connecting adjacent ones of said pn junctions to one another.

9. The white light source according to claim 8, wherein said metallic contact layer is a solder layer.

10. The white light source according to claim 1, wherein said semiconductor LED is constructed on a basis of one of GaN and InGaN.

11. The white light source according to claim 2, wherein said quantum well layers are selected from the group consisting of a single quantum well layer and multiple quantum well layers.

12. The white light source according to claim 1, wherein said emitted light has a substantially uniform intensity profile.

13. The white light source according to claim 1, wherein said emitted light has an emission spectrum with a substantially uniform intensity distribution to close spectral holes.

* * * * *

UNITED STATES PATENT AND TRADEMARK OFFICE
CERTIFICATE OF CORRECTION

PATENT NO. : 6,734,467 B2
DATED : May 11, 2004
INVENTOR(S) : Karl-Heinz Schlereth et al.

It is certified that error appears in the above-identified patent and that said Letters Patent is hereby corrected as shown below:

Column 8,
Line 4, should read as follows: -- containing an $n^+$ -doped layer and a directly adjoining --

Signed and Sealed this

Fifth Day of October, 2004

JON W. DUDAS
*Director of the United States Patent and Trademark Office*